(12) United States Patent
Nandakumar et al.

(10) Patent No.: US 8,138,045 B2
(45) Date of Patent: Mar. 20, 2012

(54) METHOD OF FORMING SIDEWALL SPACERS TO REDUCE FORMATION OF RECESSES IN THE SUBSTRATE AND INCREASE DOPANT RETENTION IN A SEMICONDUCTOR DEVICE

(75) Inventors: Mahalingam Nandakumar, Richardson, TX (US); Said Ghneim, Dallas, TX (US); Frank Scott Johnson, Wappingers Falls, NY (US)

(73) Assignee: Texas Instruments Incorporated, Dallas, TX (US)

( * ) Notice: Subject to any disclaimer, the term of this patent is extended or adjusted under 35 U.S.C. 154(b) by 528 days.

(21) Appl. No.: 12/122,885

(22) Filed: May 19, 2008

(65) Prior Publication Data

US 2009/0286375 A1 Nov. 19, 2009

(51) Int. Cl.
*H01L 21/336* (2006.01)

(52) U.S. Cl. ............ 438/265; 257/E21.639; 257/E21.64

(58) Field of Classification Search .................. 438/197, 438/213, 230, 265, 294, 303; 257/E21.409, 257/E21.625, E21.626, E21.639, E21.64
See application file for complete search history.

(56) References Cited

U.S. PATENT DOCUMENTS

| 6,800,907 | B2 * | 10/2004 | Kim et al. ...................... 257/356 |
| 7,732,280 | B2 * | 6/2010 | Kang .............................. 438/263 |
| 2004/0266154 | A1 * | 12/2004 | Lim et al. ...................... 438/592 |

* cited by examiner

*Primary Examiner* — Daniel Whalen
(74) *Attorney, Agent, or Firm* — Warren L. Franz; Wade J. Brady, III; Frederick J. Telecky, Jr.

(57) ABSTRACT

A method of forming sidewall spacers for a gate in a semiconductor device includes depositing a gate oxide layer over a gate and source/drain regions, and using a thermal anneal to oxidize silicon of the substrate and silicon of the gate after formation of the deposited oxide layer. A sidewall layer is deposited over the oxide layer following the oxidation, and the sidewall layer and oxide layer are patterned to form the sidewall spacers.

8 Claims, 5 Drawing Sheets

METHOD OF FORMING SIDEWALL SPACERS TO REDUCE FORMATION OF RECESSES IN THE SUBSTRATE AND INCREASE DOPANT RETENTION IN A SEMICONDUCTOR DEVICE

This invention relates generally to semiconductor fabrication.

BACKGROUND

As CMOS technology continues to scale further into the submicron region, the width of the gate on metal oxide semiconductor (MOS) transistors and the thickness of the gate oxide are constantly being reduced. MOS transistor gates are formed using a conductive material such as metals, silicides, and doped polycrystalline silicon (polysilicon). For MOS transistor gates formed using doped polysilicon, metal silicides are often formed on the gate structure to reduce the sheet resistance of the gate and to ensure proper electrical contract.

The self-aligned processes used to fabricate MOS transistors and other processes require the formation of a sidewall structure. Along with the reduction in MOS transistor gate width, the scaling of CMOS technology also requires that the width of the sidewall structures be reduced. Gate fabrication techniques utilize an etching process, such as plasma etching or wet chemical etching, to chemically remove material to form the microelectronic devices.

Some etching processes used in fabricating the gate remove material that would otherwise be beneficial to the construction or operation of the microelectronic device. For example, as illustrated in FIG. 3A, a polysilicon gate 402 including a thin gate oxide layer 403 is formed on a substrate 404. To form the sidewalls, an oxide layer 406 and a nitride layer 408 are formed over gate 402 and substrate 404. As illustrated in FIG. 3B, to form the gate sidewalls, nitride layer 408 is typically etched by using a plasma etch process which does not completely stop on oxide layer 406, but etches away oxide layer 406 and a portion of substrate 404, creating a recess 410 in substrate 404. Additionally, as illustrated in FIG. 3B, a subsequent oxidation step, which is used to remove the plasma etch damage, increases recess 410 because part of the silicon in substrate 404 gets converted to silicon oxide 410. The oxidation step is also referred to as the poly-oxidation or "smile" oxidation step because it creates a "smile" oxide 412 at the edge of the gate. The oxidation step is followed by the offset spacer loop.

The recess in the substrate can degrade the performance of the transistor and increase its variability. A thick smile oxide can reduce overlap capacitance and reduce transistor drive current. It is therefore desirable to minimize the silicon recess and "smile oxide" in the fabrication of the transistor structure. The present teachings provide several fabrication techniques to minimize the recess and smile oxide and improve performance.

SUMMARY

An embodiment of the present disclosure is directed to a method of fabricating a semiconductor device. The method comprises forming a polysilicon gate on an active region of the semiconductor device. The method also comprises depositing an oxide layer covering the gate, oxidizing a portion of the polysilicon of the gate and the silicon substrate to grow a thin silicon oxide layer on the gate and substrate after forming the deposited oxide layer, then forming a sidewall layer by depositing, e.g., a nitride layer covering the combined deposited and grown oxide layer, and then removing portions of the deposited sidewall layer and the combined deposited and grown oxide layer to form spacers on sidewalls of the gate.

Additional embodiments of the disclosure will be set forth in part in the description which follows, and in part will be obvious from the description, or may be learned by practice of the present disclosure. The embodiments of the disclosure will be realized and attained by means of the elements and combinations particularly pointed out in the appended claims.

It is to be understood that both the foregoing general description and the following detailed description are illustrative and explanatory only and are not restrictive of the invention, as claimed.

BRIEF DESCRIPTION OF THE DRAWINGS

The accompanying drawings, which are incorporated in and constitute a part of this specification, illustrate embodiments of the disclosure and together with the description, serve to explain the principles of the embodiments.

DETAILED DESCRIPTION OF EXAMPLE EMBODIMENTS

According to embodiments of the present disclosure, a method of forming sidewall spacers can reduce formation of recesses in the substrate of a semiconductor device and can minimize the amount of "smile" of the gate. In the method, silicon of the substrate and polysilicon of the gate are oxidized/annealed after formation of a deposited oxide layer over the gate. The substrate and gate are oxidized by performing an anneal in an oxidation atmosphere or ambient.

By oxidizing the silicon of the gate and substrate following formation of the deposited oxide, the method reduces recesses formed in the substrate during fabrication. By decreasing recessing in the substrate, the performance of the semiconductor device is improved. Further, the oxidation/anneal densifies the deposited oxide layer making it resistant to etch processes, drives in dopants trapped near the surface, and reduces thickness variations in the gate oxide layer.

Figure 1:
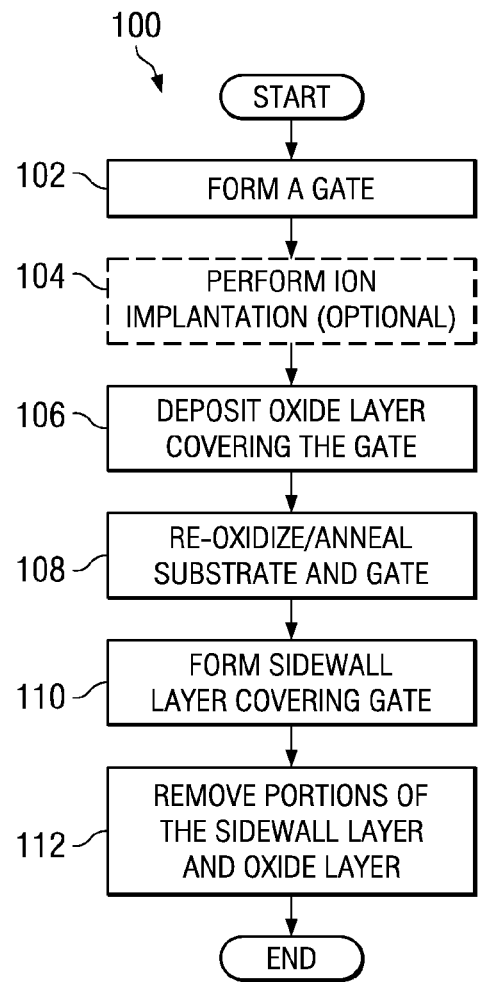
FIG. 1 is a flow diagram illustrating a semiconductor fabrication method consistent with embodiments of the present disclosure.

FIG. 1 illustrates a method 100 for forming sidewall spacers according to embodiments of the present disclosure. In method 100, portions of the polysilicon gate and the silicon substrate are oxidized after formation of the gate and after depositing an oxide layer covering the gate.

Method 100 begins with a gate of a semiconductor device being formed on a substrate (step 102). The substrate may be any type of substrate on which the semiconductor device, such as a MOSFET, may be formed. For example, the substrate may be a silicon wafer, a silicon wafer with previously embedded devices, an epitaxial layer grown on a wafer, a silicon-on-insulator ("SOI") substrate, or other suitable substrate having any suitable crystal orientation.

The gate may be formed using any suitable growth and/or deposition techniques available in semiconductor processing and may be formed of any suitable material or combination of materials. For example, the gate may be formed by depositing or growing a gate insulator layer on the substrate and forming a gate material layer or layers on the gate insulator layer. Then, the gate insulator layer and gate material layer may be patterned and portions removed using suitable and well-known techniques, such as etching, polishing, and the like, to form the gate. One skilled in the art will realize that the gate may include additional well-known components.

An ion implantation is optionally performed next to create a source region and a drain region on either side of the gate (step 104). The ion implantation may be performed using any suitable techniques available in semiconductor processing and any suitable dopant to form the source and drain regions. Although, the ion implantation may optionally be performed after forming the gate, one skilled in the art will realize that the ion implantation may be performed at any stage during the semiconductor fabrication process.

Then, an oxide layer is deposited to cover the gate and portions of the substrate (step 106). The oxide layer may be formed using any suitable deposition techniques available in semiconductor processing and may be formed from any suitable material or combination of materials.

Next, the silicon of the substrate and of the polysilicon of the gate is oxidized/annealed to form a grown oxide layer (step 108). The oxidation/anneal may be achieved using any suitable method to form a grown oxide layer in the materials of the substrate and gate. For example, a thermal anneal, such as a rapid thermal anneal, spike anneal, ultra-high temperate anneal or combination thereof, may be performed in an oxidizing atmosphere or ambient.

By oxidizing/annealing the substrate, method 100 reduces recesses formed in the substrate during fabrication. By preventing recesses, the performance of the semiconductor device may be increased. Further, the oxidation/anneal densifies the previously deposited oxide layer, making it resistant to etch processes. Moreover, by oxidizing/annealing the substrate, dopants trapped near the surface of the substrate can be driven in rather than lost.

Then, after the oxidizing/anneal step, a sidewall layer is formed covering the gate and portions of the substrate over the deposited oxide layer (step 110). The sidewall layer may be formed using any suitable layer formation techniques available in semiconductor processing and may be formed from any suitable material or combination of materials.

After that, portions of the sidewall layer and the oxide layer are removed (step 112) to form spacers on the sidewalls of the gate. Additionally, the portions are removed in order to expose the substrate and the top of the gate. Portions of the sidewall layer and the oxide layer may be removed using any suitable material removal techniques available in semiconductor processing, such as etch processes.

One skilled in the art will realize that additional semiconductor fabrication processes may be performed to complete the semiconductor device. Additionally, one skilled in the art will realize that additional semiconductor devices may be fabricated to operate with the semiconductor device fabricated by method 100.

FIGS. 2A-2F illustrate a method for forming a MOSFET including sidewall spacers.

Figure 2A:
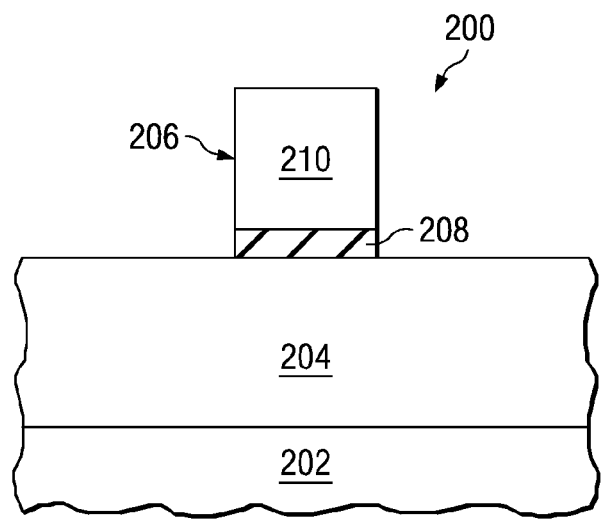
FIGS. 2A-2F are diagrams illustrating a semiconductor fabrication method consistent with embodiments of the present disclosure.

FIG. 2A is a generalized diagram illustrating MOSFET device 200 having a form such as a NMOS transistor, PMOS transistor, CMOS transistor, or other similar semiconductor device. As illustrated, MOSFET 200 includes a buried oxide layer 202, a substrate layer 204, and a gate 206. It should be readily apparent to those of ordinary skill in the art that MOSFET 200 illustrated in FIG. 2A represents a generalized illustration and that other components may be added or existing components may be removed or modified. Further, MOSFET 200 may be part of an integrated circuit which includes other semiconductor devices.

Buried oxide layer 202 may be formed from any suitable oxide material. Likewise, substrate layer 204 may be formed from any suitable semiconductor material, such as silicon. For example, substrate layer 204 may be a layer of a silicon waferhaving an oxide layer 202, such as a silicon dioxide ($SiO_2$) layer, buried in the silicon wafer.

Substrate layer 204 may include an active region formed under gate 206. The active region may include either an N-type well region or a P-type well region, depending on the particular conductivity type of MOSFET 200. The well region may be formed using any suitable techniques used in semiconductor processing, such as ion implantation.

Gate 206 may include a gate insulator 208 underlying a gate electrode material 210. Gate 206, including gate insulator 208 and gate material 210, may be formed from any suitable material or combination of materials. For example, gate insulator 208 may be formed of $SiO_2$, nitrided $SiO_2$, hafnium oxide ($HfO_2$), hafnium silicate ($HfSiO_4$), or the like. For example, gate material 210 may be formed of polysilicon or the like.

Gate 206 may be formed using any suitable growth and/or deposition techniques available in semiconductor processing. For example, gate 206 may be formed by depositing or growing a gate insulator layer on substrate 204 and forming a gate electrode material layer on the gate insulator layer. Then, the gate insulator layer and the gate electrode material layer may be patterned and portions removed using suitable and well-known techniques to form a MOSFET gate. One skilled in the art will realize that the shown gate 206 structure is given as an example and that gate 206 may include additional well-known components.

Figure 2B:
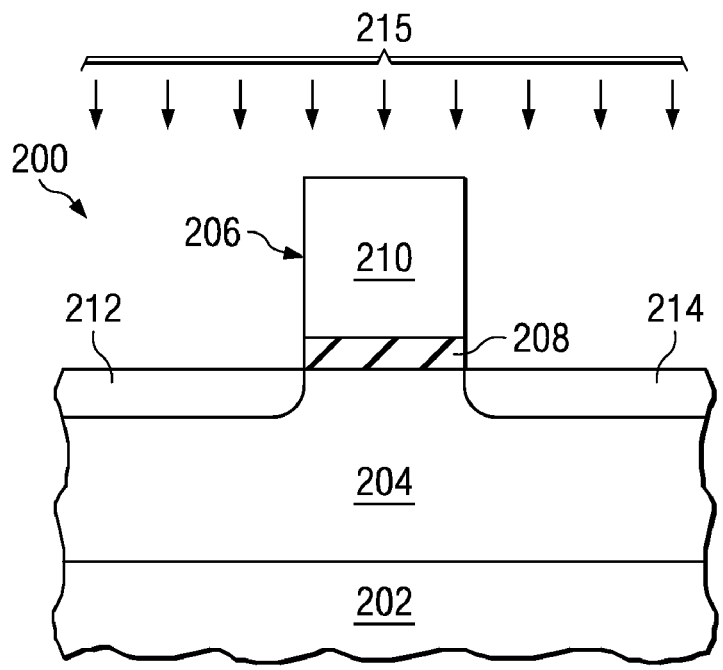

As illustrated in FIG. 2B, after formation of the gate 206, a source region 212, including a source, and a drain region 214, including a drain, may be formed on respective different sides of gate 206. Both source region 212 and drain region 214, may be formed using any suitable techniques available in semiconductor processing, such as an ion implantation process 215. For example, boron or other suitable P-type dopant may be implanted during the ion implantation process 215 to form source region 212 and drain region 214 for a P-type MOSFET transistor 200. Alternatively, arsenic, phosphorous, antimony, or other suitable N-type dopant may be implanted during the ion implantation process 215 to form source region 212 and drain region 214 for an N-type MOSFET transistor 200.

Although not separately illustrated in FIG. 2B, both source region 212 and drain region 214 may have both heavily doped and lightly doped regions. After the ion implantation into source region 212 and drain region 214, an anneal process may be performed for diffusion of the dopant. One skilled in the art will realize that this anneal process may be carried out at any suitable temperature for any suitable time period.

Figure 2C:
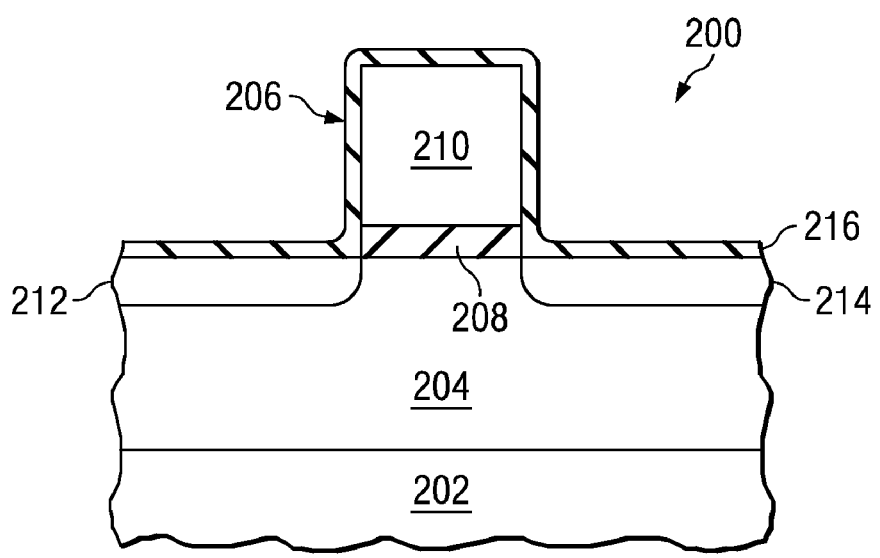

As illustrated in FIG. 2C, after forming source region 212 and drain region 214, a deposited oxide layer 216 may be formed to cover gate 206 and portions of substrate 204. Oxide layer 216 may be formed using any suitable oxide layer deposition techniques available in semiconductor processing and may be formed from any suitable material or combination of materials.

Oxide layer 216 may be formed to any suitable thickness to serve as a spacer on gate 206. For example, oxide layer 216 may be formed to a thickness ranging from approximately 20 Å to 70 Å.

Figure 2D:
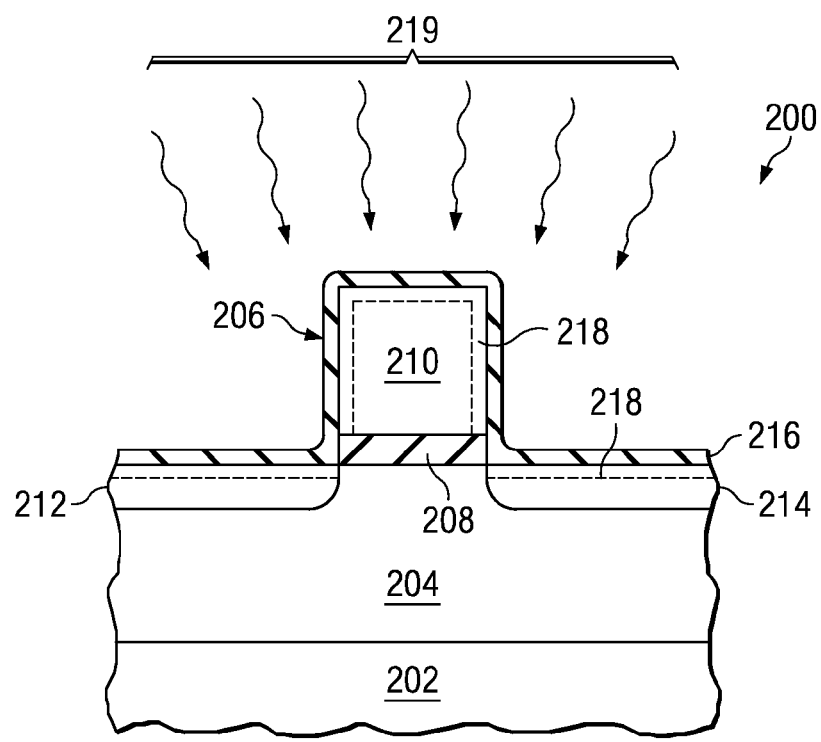

As illustrated in FIG. 2D, after forming deposited oxide layer 216, gate material 210 of gate 206 and deposited oxide layer 216 can be subjected to an oxidizing/annealing process 219. Oxidation/anneal process 219 may be achieved using any suitable method to grow an oxide layer 218. For example, a thermal anneal, such as a rapid thermal anneal, spike anneal, ultra-high temperate anneal or combination thereof, may be performed in an oxidizing atmosphere or ambient.

One skilled in the art will realize that this anneal process may be carried out at any suitable temperature for any suitable time period. For example, a spike anneal can be carried out at about 900 degrees C. to about 1000 degrees C., or a flash/laser anneal can be carried out at about 1150 degrees C. to about 1400 degrees C.

Thermally grown oxide layer 218 may be formed to any suitable thickness. For example, grown oxide layer 218 may be formed to approximately 5 Å.

By also oxidizing/annealing the substrate, recesses formed in the substrate during fabrication may be reduced. By preventing recesses in the substrate, the performance of the semiconductor device may be improved. Further, the oxidation/anneal densifies the deposited oxide layer 216 making it resistant to etch processes. Moreover, by also oxidizing/annealing the substrate, dopants trapped near the surface of the substrate can be driven in, rather than lost.

Figure 2E:
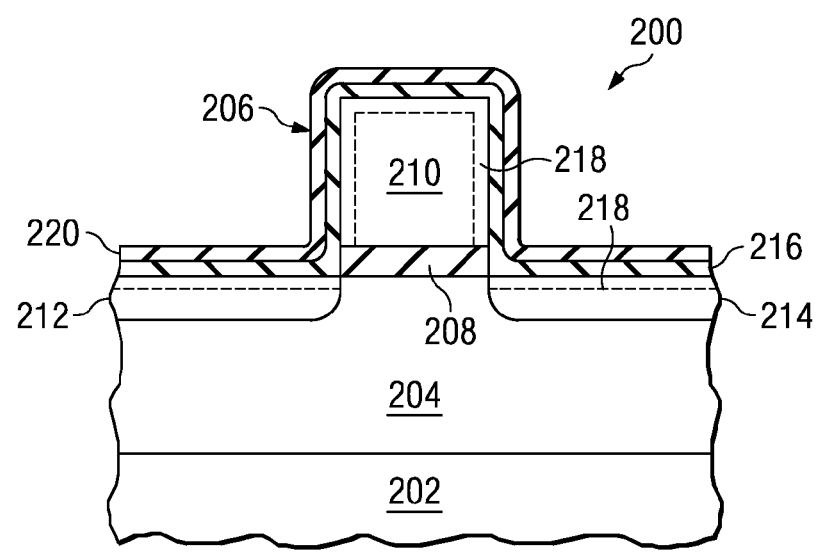

As illustrated in FIG. 2E, after the oxidation/anneal, a sidewall layer 220 may be formed to cover the combined deposited oxide layer 216 and thermally grown oxide layer 218 over gate 206 and portions of substrate layer 204. Sidewall layer 220 may be formed from any suitable material or combination of materials. For example, sidewall layer 220 may be formed of silicon nitride (SiN), silicon carbide (SiC), silicon carbonitride (SiCN), silicon oxynitride (SiON), silicon oxycarbide (SiOC), silicon oxycarbonitride (SiOCN), or combinations thereof.

Sidewall layer 220 may be formed using any suitable layer formation techniques available in semiconductor processing. For example, sidewall layer 220 may be formed by chemical vapor deposition (CVD), atmospheric pressure chemical vapor deposition (APCVD), low pressure chemical vapor deposition (LPCVD), plasma enhanced chemical vapor deposition (EPCVD), rapid thermal chemical vapor deposition (RTCVD), metal-organic chemical vapor deposition (MOCVD), physical vapor deposition (PVD), or the like.

Figure 2F:
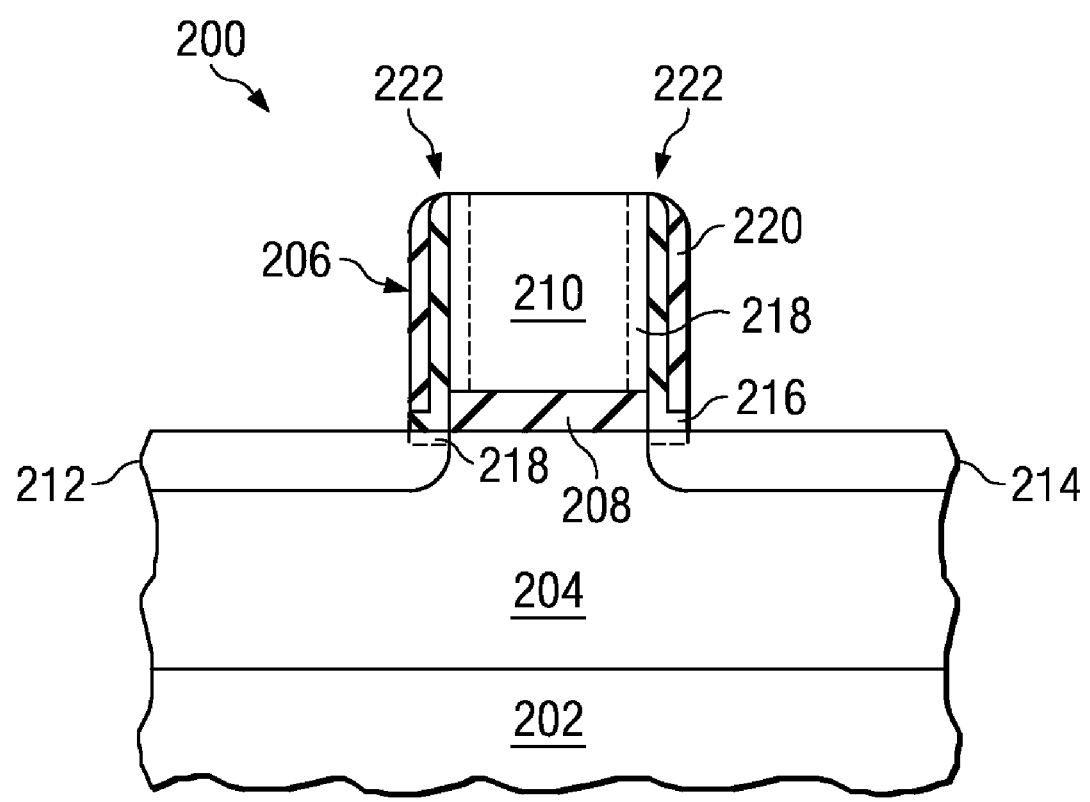
Figure 3A:
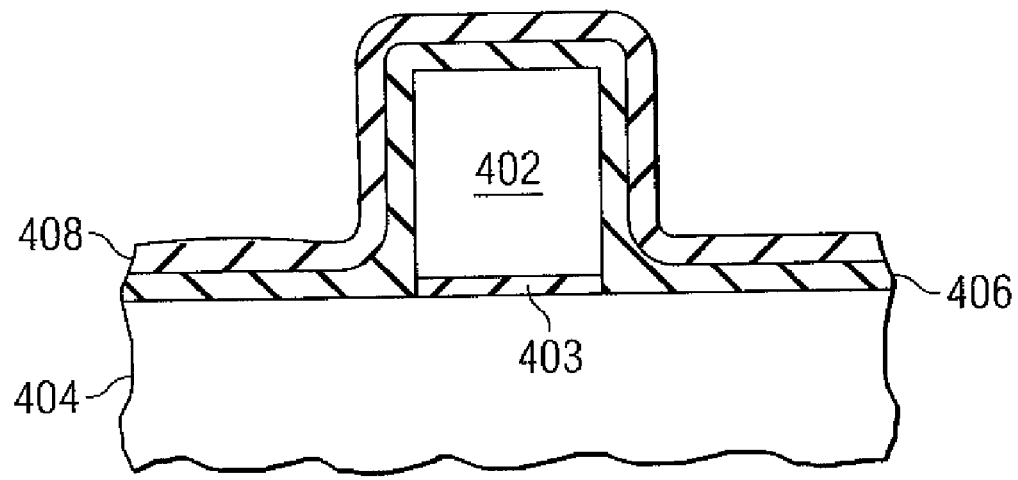
FIGS. 3A and 3B (Prior Art) are diagrams illustrating a conventional semiconductor fabrication method.
Figure 3B:
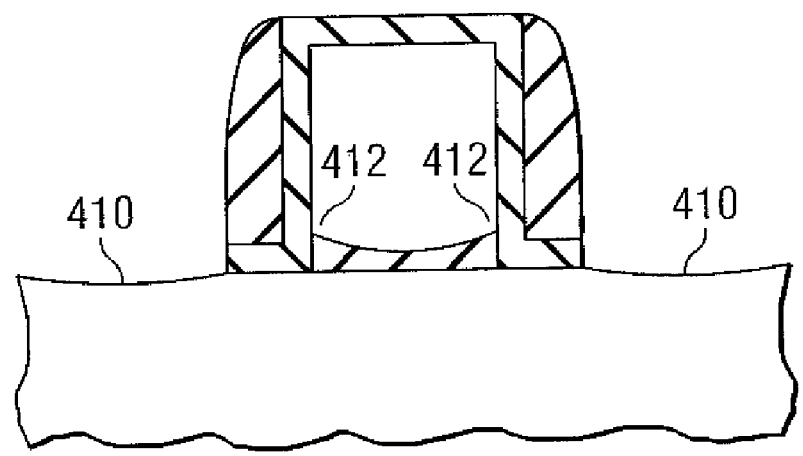

As illustrated in FIG. 2F, after formation of sidewall layer 220, portions of sidewall layer 220 and of oxide layer 216 may be removed to form spacers 222. Spacers 222 may be formed using any suitable material removal techniques available in semiconductor processing. For example, sidewall layer 220 and oxide layer 216 may be selectively removed by one or more etch processes, such as wet etch, dry etch, anisotropic etch, and the like, to expose a top portion of gate 206, source region 212, and drain region 214. One skilled in the art will realize that this etch process may be carried out using any suitable chemical for any suitable time period to form spacers 222.

In the process described above with reference to FIGS. 2A-2F, source region 212 and drain region 214 may optionally be formed after forming gate 206 and prior to depositing oxide layer 216 and thermally oxidizing gate 206, as indicated in dashed lines for step 104 in method 100 discussed with reference to FIG. 1 above. However, one skilled in the art will realize that source region 212 and drain region 214 may be formed at any stage during the process including, but not limited to, after formation of spacers 222.

Those skilled in the art will appreciate that other embodiments and variations of described embodiments are possible within the scope of the claimed invention.

What is claimed is:

1. A method of fabricating a semiconductor device, comprising:
    forming a gate insulator layer over a substrate comprising silicon;
    forming a gate material layer comprising polysilicon over the gate insulator layer;
    patterning the gate material layer and the gate insulator layer to form a gate;
    depositing an oxide layer to cover the gate and portions of the substrate;
    after depositing the oxide layer, oxidizing portions of the covered gate and the portions of the substrate, thereby growing a silicon oxide layer in the materials of the gate and substrate and defining a combined deposited and grown oxide layer;
    forming a sidewall layer over the combined deposited and grown oxide layer covering the gate and the portions of the substrate; and
    etching portions of the sidewall layer and of the combined deposited and grown oxide layer to form spacers on sidewalls of the gate.

2. The method of claim 1, wherein the deposited oxide layer is deposited to a thickness of approximately 20 Å to 70 Å.

3. The method of claim 2, wherein the grown silicon oxide layer is grown to a thickness of approximately 5 Å.

4. The method of claim 3, wherein the oxidizing includes performing a spike anneal at a temperature of about 900 degrees C. to about 1000 degrees C.

5. The method of claim 3, wherein the oxidizing includes performing a flash/laser anneal at a temperature of about 1150 degrees C. to about 1400 degrees C.

6. The method of claim 3, wherein the sidewall layer comprises at least one of silicon nitride (SiN), silicon carbide (SiC), silicon carbonitride (SiCN), silicon oxynitride (SiON), silicon oxycarbide (SiOC) or silicon oxycarbonitride (SiOCN).

7. The method of claim 6, wherein the gate insulator layer comprises at least one of $SiO_2$, nitrided $SiO_2$, hafnium oxide ($HfO_2$) or hafnium silicate ($HfSiO_4$).

8. The method of claim 1, further comprising implanting ions into the substrate to form source and drain regions on either side of the gate.

* * * * *